(12) United States Patent
Lu

(10) Patent No.: US 10,001,895 B2
(45) Date of Patent: Jun. 19, 2018

(54) TOUCH CONTROL DEVICE EASY TO DISPLAY TEMPERATURE AND TIME AND METHOD THEREOF

(71) Applicant: Dong Guan Song Wei Electric Technology Co., Ltd., Dongguan (CN)

(72) Inventor: Weilin Lu, Dongguan (CN)

(73) Assignee: DONG GUAN SONG WEI ELECTRIC TECHNOLOGY CO., LTD., Dongguan, Guangdong (CN)

( * ) Notice: Subject to any disclaimer, the term of this patent is extended or adjusted under 35 U.S.C. 154(b) by 62 days.

(21) Appl. No.: 15/335,442

(22) Filed: Oct. 27, 2016

(65) Prior Publication Data

US 2018/0120984 A1 May 3, 2018

(51) Int. Cl.
*G06F 3/00* (2006.01)
*G06F 3/046* (2006.01)
*H01L 33/52* (2010.01)
*H01L 33/48* (2010.01)
*F24C 7/08* (2006.01)

(52) U.S. Cl.
CPC .............. *G06F 3/046* (2013.01); *F24C 7/081* (2013.01); *H01L 33/486* (2013.01); *H01L 33/52* (2013.01)

(58) Field of Classification Search
CPC ....... H01L 33/486; H01L 33/52; G06F 3/046; F24C 7/081
See application file for complete search history.

(56) References Cited

U.S. PATENT DOCUMENTS

| | | | | |
|---|---|---|---|---|
| 2004/0074978 A1* | 4/2004 | Rosen | ............... | G05D 23/1904 236/1 C |
| 2008/0309865 A1* | 12/2008 | Sugita | ............... | G02F 1/133382 349/150 |
| 2013/0233841 A1* | 9/2013 | Gallo | ............... | H05B 1/00 219/201 |

\* cited by examiner

*Primary Examiner* — Muhammad N Edun
(74) *Attorney, Agent, or Firm* — Leong C. Lei

(57) ABSTRACT

A touch control device easy to display temperature and time and a method thereof are provided. The touch control device is used to an electric fireplace or a heater. The touch control device includes a casing, a touch display screen, a touch nixie tube, and an operation panel. Through the touch nixie tube composed of the touch pad, the touch IC, the luminous member, the light blocker, the inductive electrode and the light-guide layer, the light emitted from the luminous member can be projected to the light-guide layer. The user can see a character sign from the surface of the operation panel.

8 Claims, 7 Drawing Sheets

TOUCH CONTROL DEVICE EASY TO DISPLAY TEMPERATURE AND TIME AND METHOD THEREOF

BACKGROUND OF THE INVENTION

1. Field of the Invention

The present invention relates to a touch control device for an electric appliance, and more particularly to a touch control device easy to display temperature and time and a method thereof.

2. Description of the Prior Art

Electric fireplaces and heaters are essential household appliances in winter, which generally have heating and decorative functions and are ideal home supplies. People not only enjoy the convenience of the electric fireplaces and the heaters but also have more modern requirements for the electric fireplaces and the heaters. A conventional electric fireplace is provided with an illuminating device to radiate light. The light is reflected to form flame-shaped light to be projected on an image screen. However, the conventional electric fireplace is provided with mechanical buttons. It is not easy to design the mechanical buttons, and the mechanical buttons cannot be hidden. This causes the appearance of the electric fireplace is not pleasing. Besides, the conventional electric fireplace is unable to display temperature and time. Accordingly, the inventor of the present invention has devoted himself based on his many years of practical experiences to solve this problem.

SUMMARY OF THE INVENTION

The primary object of the present invention is to provide a touch control device easy to display temperature and time and a method thereof, which is able to hide touch buttons and easy to display temperature and time.

According to one aspect of the present invention, a touch control device easy to display temperature and time is provided. The touch control device is used to an electric fireplace or a heater and comprises a casing, a touch display screen, a touch nixie tube, and an operation panel. Both the touch display screen and the touch nixie tube are disposed in the casing. The operation panel is disposed on top of the touch display screen and the touch nixie tube. The touch nixie tube includes a touch pad, a touch IC, a luminous member, a light blocker, an inductive electrode, and a light-guide layer. The touch pad is connected with a master control board of the electric fireplace or the heater. The touch IC, the luminous member, the light blocker, and the inductive electrode are disposed on the touch pad. The touch IC and the luminous member are electrically connected with the touch pad. The luminous member and the inductive electrode are located in the light blocker. The inductive electrode leads an input signal to be connected with a pin of the touch IC. The light-guide layer is provided with a sign character layer thereon. The light-guide layer is disposed between a bottom surface of the operation panel and an upper end surface of the light blocker.

According to another aspect of the present invention, a touch control method easy to display temperature and time by using the aforesaid touch control device is provided. The touch display screen displays temperate and time data. A control signal is electrically connected with the master control board. The touch display screen has a first pattern to display temperature, a slide block for adjusting temperature, and a second pattern to display time. By sliding numeric, time and date are adjusted and displayed. The master control board is connected to the touch pad by means of communication of a single chip microcomputer. The luminous member of the touch nixie tube is controlled by the master control board or the touch IC on the touch pad. Light emitted from the luminous member is projected to a control state sign of the light-guide layer. A user can see a character sign from a surface of the operation panel. When the luminous member is extinguished, the character sign appeared on the surface of the operation panel will disappear.

Preferably, the first pattern has a circle shape, and the second pattern has a bar shape.

Compared to the prior art, the present invention has obvious advantages and beneficial effects.

Through the touch nixie tube composed of the touch pad, the touch IC, the luminous member, the light blocker, the inductive electrode and the light-guide layer, the light emitted from the luminous member can be projected to the light-guide layer. The user can see the character sign from the surface of the operation panel. When the luminous member is extinguished, the character sign appeared on the surface of the operation panel will disappear. The touch buttons won't be seen, providing a function to hide the touch buttons. There is no need to use a mechanical external force control. The operation buttons of the electric fireplace or the heater can be designed easily, which is beneficial for the design of the appearance of the product. The appearance of the product is more pleasing. In cooperation with the touch display screen, the temperature and the time can be set quickly, instead of the traditional electric fireplace or the heater which needs a long time to adjust the temperature and the time. The innovative design for the control panel has great significance.

DETAILED DESCRIPTION OF THE PREFERRED EMBODIMENTS

Embodiments of the present invention will now be described, by way of example only, with reference to the accompanying drawings.

As shown in FIG. 1 to FIG. 7, a touch control device easy to display temperature and time according to a preferred embodiment of the present invention, used to an electric fireplace or a heater, comprises a casing 10, a touch display screen 20, a touch nixie tube 30, and an operation panel 40.

Figure 1:
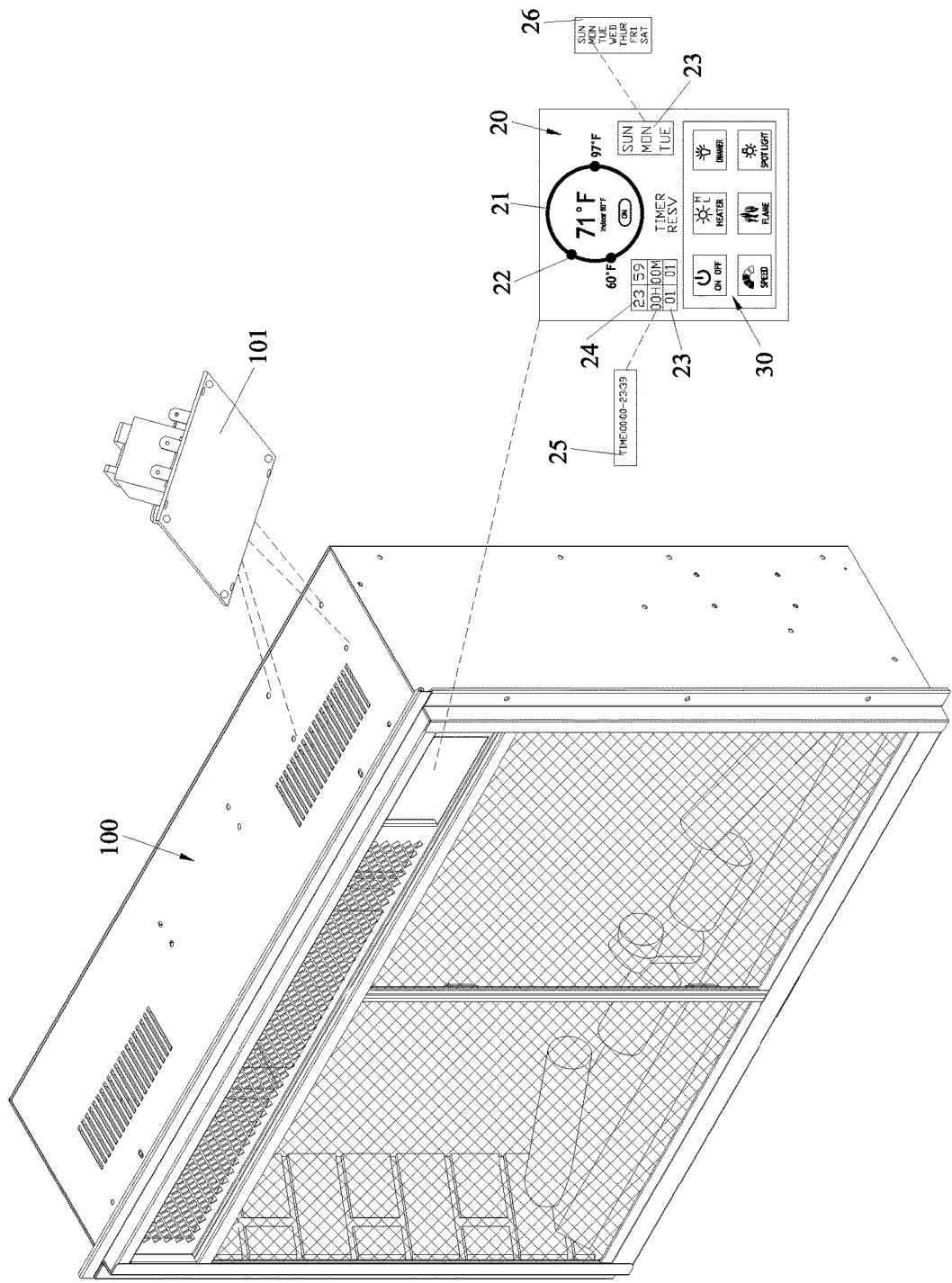
FIG. 1 is a perspective view according to a preferred embodiment of the present invention.
Figure 2:
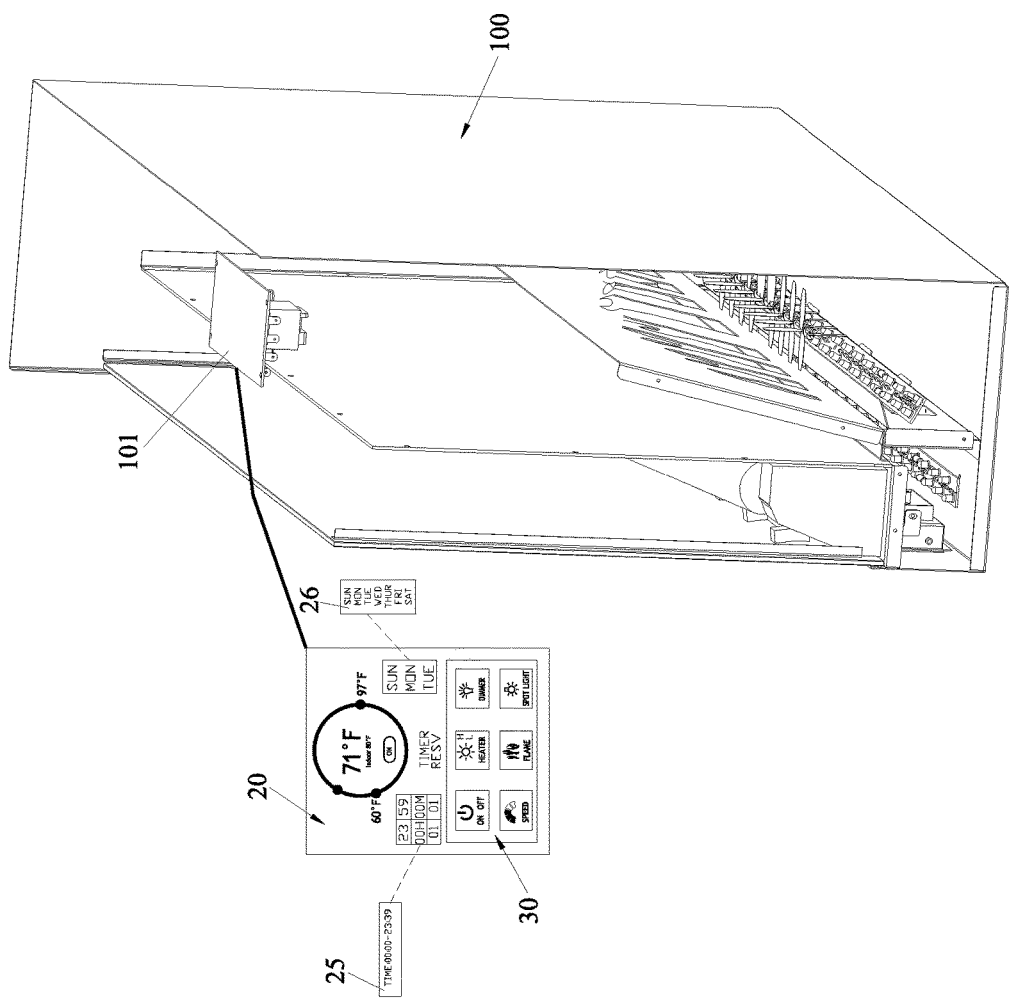
FIG. 2 is a partial assembled view according to the preferred embodiment of the present invention.
Figure 3:
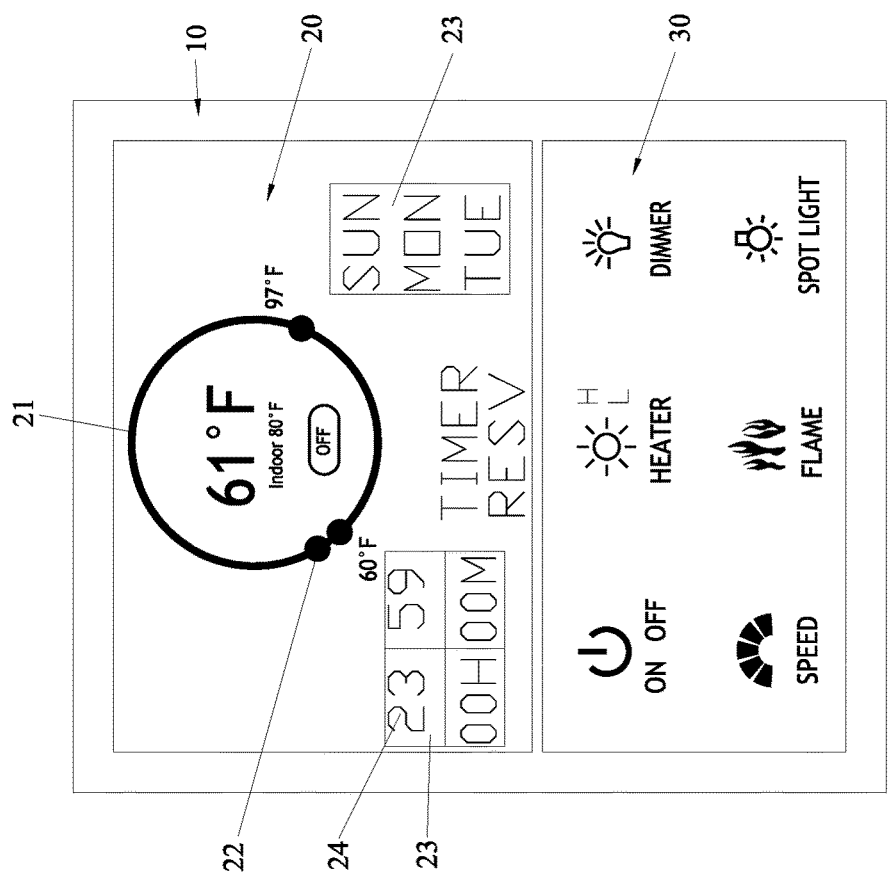
FIG. 3 is a front view of the touch control device according to the preferred embodiment of the present invention.
Figure 4:
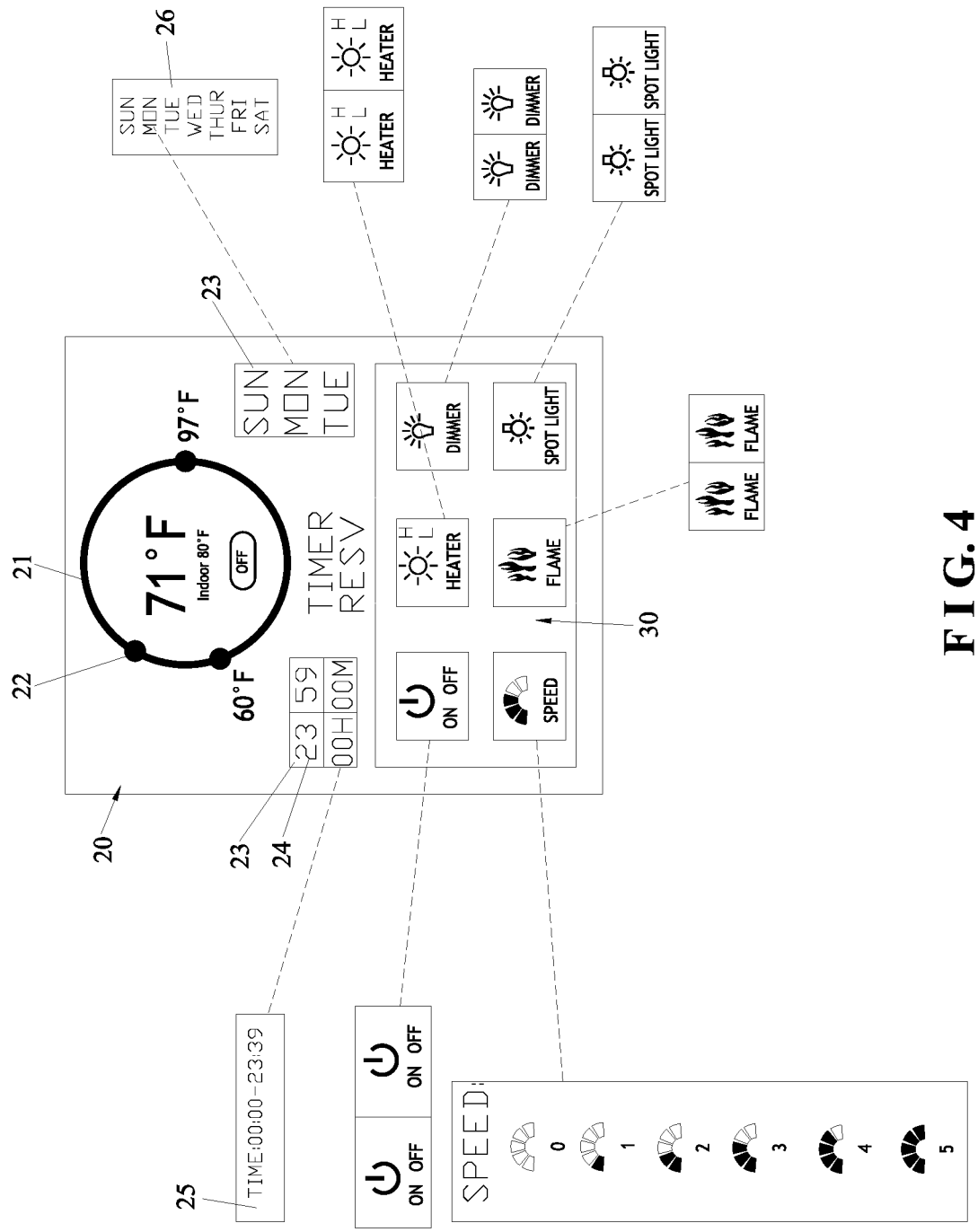
FIG. 4 is a front view of the touch control device in various realistic states according to the preferred embodiment of the present invention.
Figure 5:
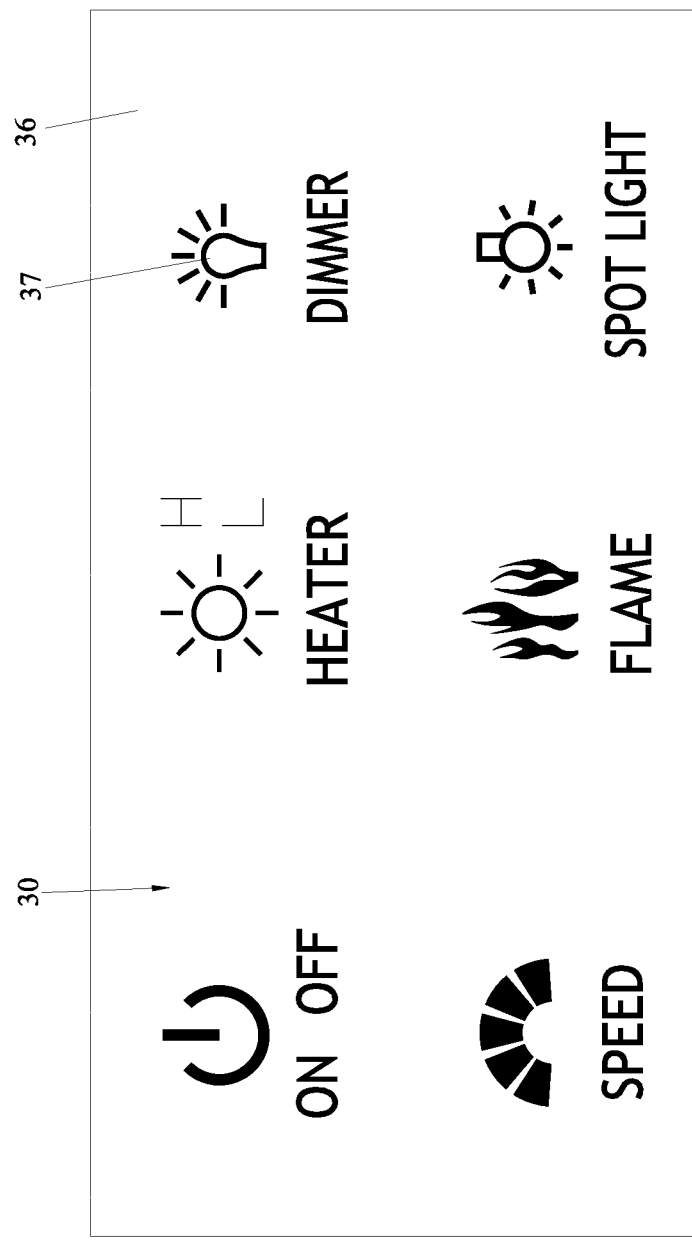
FIG. 5 is a front view of the touch nixie tube according to the preferred embodiment of the present invention.
Figure 6:
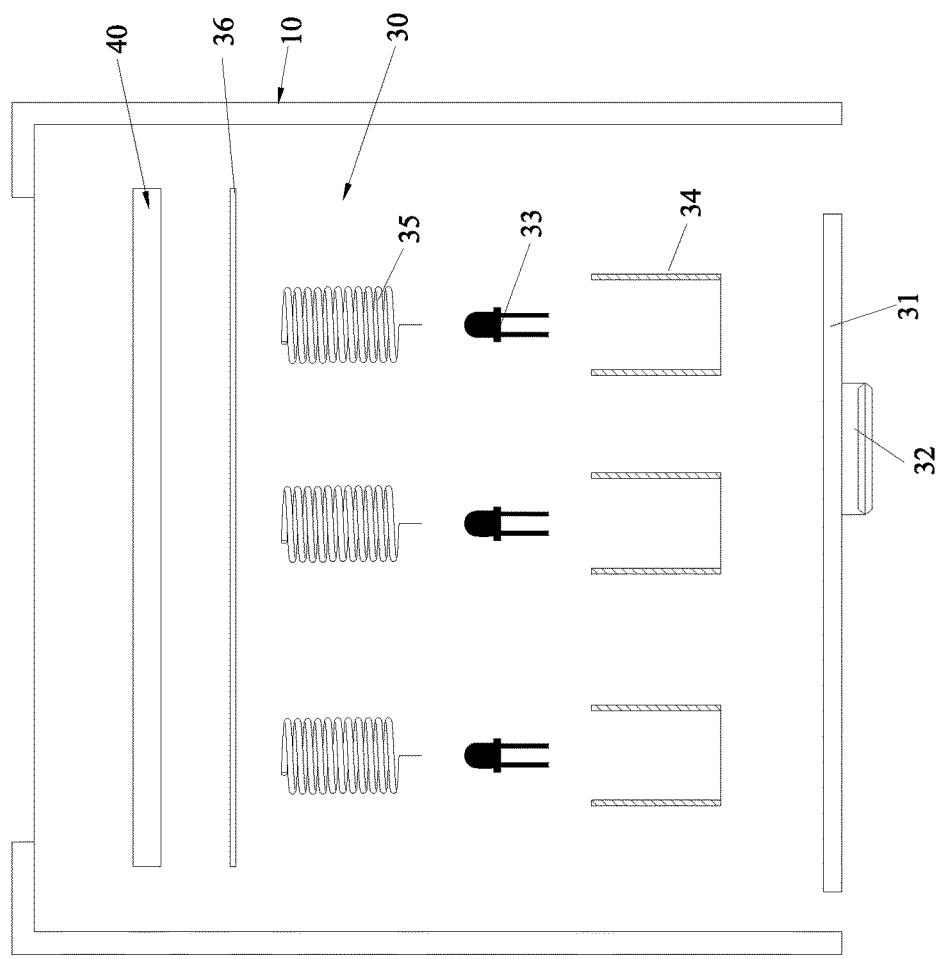
FIG. 6 is an exploded view of the touch nixie tube according to the preferred embodiment of the present invention.
Figure 7:
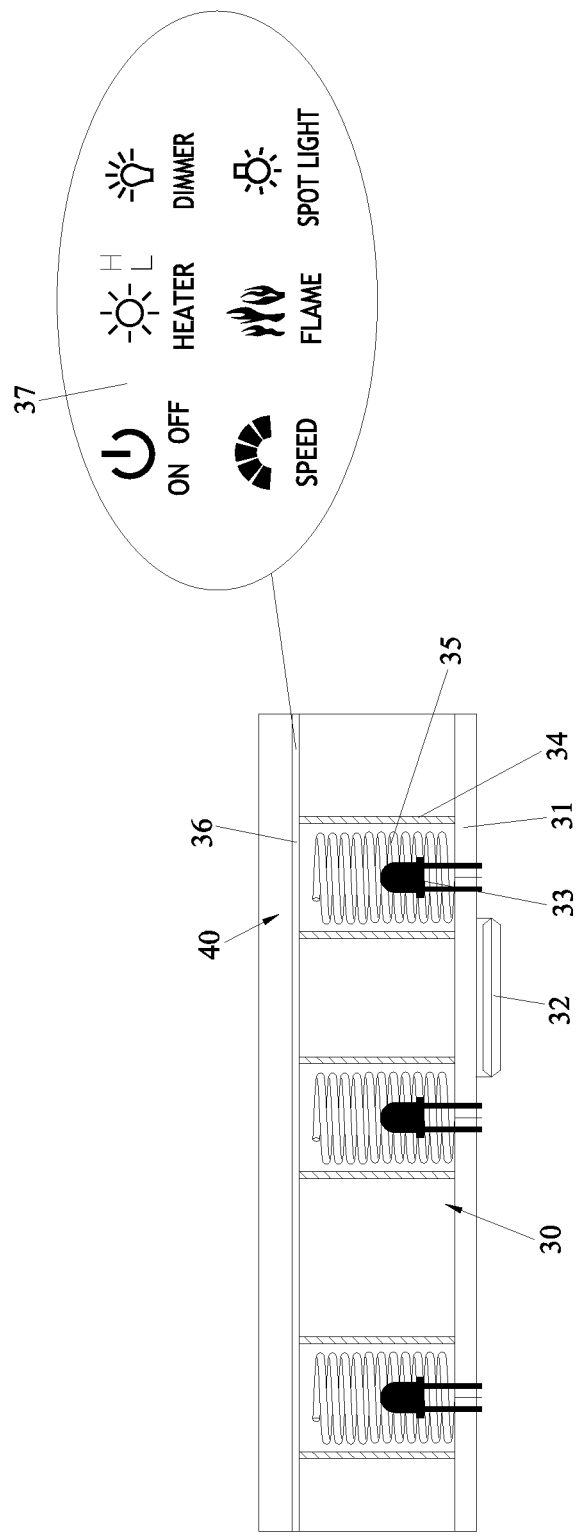
FIG. 7 is a cross-sectional view of the touch nixie tube according to the preferred embodiment of the present invention.

The touch display screen 20 is composed of a capacitive touch screen or a touch nixie tube. The touch display screen 20 is connected with a touch pad 31 or a master control board 101. Both the touch display screen 20 and the touch nixie tube 30 are disposed in the casing 10. The operation panel 40 is disposed on top of the touch display screen 20 and the touch nixie tube 30. As shown in FIG. 6 and FIG. 7, the touch nixie tube 30 includes a touch pad 31, a touch IC 32, a luminous member 33, a light blocker 34, an inductive electrode 35, and a light-guide layer 36. The touch pad 31 is connected with the master control board 101 of the electric fireplace 100 or the heater. The touch IC 32, the luminous member 33, the light blocker 34, and the inductive electrode 35 are all disposed on the touch pad 31. The touch IC 32 and the luminous member 33 are electrically connected with the touch pad 31. The luminous member 33 and the inductive electrode 35 are located in the light blocker 34. The inductive electrode 35 leads an input signal and to be connected with a pin of the touch IC 32. The light-guide layer 36 is provided with a sign character layer 37 thereon. The sign character layer 37 includes a printed control state sign. The light-guide layer 36 is disposed between a bottom surface of the operation panel 40 and an upper end surface of the light blocker 34.

In this embodiment, the luminous member 33 is a light emitting diode (LED). The LED may be red, yellow, green or blue. The LED may be encapsulated by means of plug-in or SMD (surface mount devices). The light blocker 34 may be an integral plastic cover to cover the luminous member 33 so as to prevent light leak which influences the crosstalk of light. The inductive electrode 35 is a spring or a PCB (printed circuit board) metal bond pad. In this embodiment, the inductive electrode 35 is a spring. The luminous member 33 is placed in the spring or directly soldered on the touch pad 31. The light-guide layer 36 includes at least one light-pervious area (not shown in the drawings). The at least one light-pervious area is aligned with the route of the light emitted from the luminous member 33. The control state sign is disposed in at least one bore passing by the light route.

The operation panel 40 is a piece of glass or an insulation plate. The operation panel 40 includes a light-pervious film attached to a light-proof plate or a light-pervious plate. The surface of the operation panel 40 needn't be printed any character sign.

The present invention further discloses a touch control method easy to display temperature and time by using the aforesaid touch control device. The touch display screen 20 displays temperate and time data. The control signal is electrically connected with the master control board 101. The touch display screen 20 has a first pattern 21 to display temperature. The first pattern 21 has a circle shape or other shape. The touch display screen 20 has a slide block 22 for adjusting temperature. The touch display screen 20 has a second pattern 23 to display time. The second pattern 23 has a bar shape or other shape. By sliding numeric 24, time 25 and date 26 are adjusted and displayed. The master control board 101 is connected to the touch pad 31 by means of communication of a single chip microcomputer. The luminous member 33 of the touch nixie tube 30 is controlled by the master control board 101 or the touch IC 32 on the touch pad 31. Preferably, the luminous member 33 can be extinguished with a delay. The light emitted from the luminous member 33 can be projected to the control state sign of the light-guide layer 36. The user can see the character sign from the surface of the operation panel 40. When the luminous member 33 is extinguished, the character sign appeared on the surface of the operation panel 40 will disappear. The touch buttons won't be seen, providing a function to hide the touch buttons.

The feature of the present invention is that through the touch nixie tube composed of the touch pad, the touch IC, the luminous member, the light blocker, the inductive electrode and the light-guide layer, the light emitted from the luminous member can be projected to the light-guide layer. The user can see the character sign from the surface of the operation panel. When the luminous member is extinguished, the character sign appeared on the surface of the operation panel will disappear. The touch buttons won't be seen, providing a function to hide the touch buttons. There is no need to use a mechanical external force control. The operation buttons of the electric fireplace or the heater can be designed easily, which is beneficial for the design of the appearance of the product. The appearance of the product is more pleasing. In cooperation with the touch display screen, the temperature and the time can be set quickly, instead of the traditional electric fireplace or heater which needs a long time to adjust the temperature and the time. The innovative design for the control panel has great significance.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. A touch control device easy to display temperature and time, used to an electric fireplace or a heater, comprising a casing, a touch display screen, a touch nixie tube, and an operation panel; both the touch display screen and the touch nixie tube being disposed in the casing, the operation panel being disposed on top of the touch display screen and the touch nixie tube, the touch nixie tube including a touch pad, a touch IC, a luminous member, a light blocker, an inductive electrode, and a light-guide layer; the touch pad being connected with a master control board of the electric fireplace or the heater, the touch IC, the luminous member, the light blocker, and the inductive electrode being disposed on the touch pad, the touch IC and the luminous member being electrically connected with the touch pad, the luminous member and the inductive electrode being located in the light blocker, the inductive electrode leading an input signal to be connected with a pin of the touch IC, the light-guide layer being provided with a sign character layer thereon, the light-guide layer being disposed between a bottom surface of the operation panel and an upper end surface of the light blocker.

2. The touch control device easy to display temperature and time as claimed in claim 1, wherein the touch display screen is composed of a capacitive touch screen or a touch nixie tube, and the touch display screen is connected with the touch pad or the master control board.

3. The touch control device easy to display temperature and time as claimed in claim 1, wherein the luminous member is a light emitting diode (LED), the LED is red, yellow, green or blue, and the LED is encapsulated by means of plug-in or SMD (surface mount devices).

4. The touch control device easy to display temperature and time as claimed in claim 1, wherein the inductive electrode is a spring or a PCB (printed circuit board) metal bond pad.

5. The touch control device easy to display temperature and time as claimed in claim 4, wherein the luminous member is placed in the spring or directly soldered on the touch pad.

6. The touch control device easy to display temperature and time as claimed in claim 1, wherein the light-guide layer includes at least one light-pervious area, the at least one light-pervious area is aligned with a route of light emitted from the luminous member.

7. The touch control device easy to display temperature and time as claimed in claim 1, wherein the operation panel is a piece of glass or an insulation panel.

8. The touch control device easy to display temperature and time as claimed in claim 1, wherein the operation panel comprises a light-pervious film attached to a light-proof plate or a light-pervious plate.

\* \* \* \* \*